(12) United States Patent
Tsai et al.

(10) Patent No.: US 9,252,019 B2
(45) Date of Patent: Feb. 2, 2016

(54) SEMICONDUCTOR DEVICE AND METHOD FOR FORMING THE SAME

(75) Inventors: Wen-Chi Tsai, Hsin-Chu (TW);
Chia-Han Lai, Zhubei (TW);
Yung-Chung Chen, Hsin-Chu (TW);
Mei-Yun Wang, Chu-Pei (TW);
Chii-Ming Wu, Taipei (TW);
Fang-Cheng Chen, Hsin-Chu (TW);
Huang-Ming Chen, Hsin-Chu (TW);
Ming-Ta Lei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/222,502

(22) Filed: Aug. 31, 2011

(65) Prior Publication Data

US 2013/0049219 A1  Feb. 28, 2013

(51) Int. Cl.
| H01L 21/768 | (2006.01) |
| H01L 21/285 | (2006.01) |
| H01L 29/417 | (2006.01) |
| H01L 21/02 | (2006.01) |
| H01L 29/66 | (2006.01) |

(52) U.S. Cl.
CPC .... *H01L 21/28512* (2013.01); *H01L 21/02063* (2013.01); *H01L 21/28518* (2013.01); *H01L 21/76802* (2013.01); *H01L 21/76805* (2013.01); *H01L 21/76814* (2013.01); *H01L 21/76825* (2013.01); *H01L 21/76831* (2013.01); *H01L 21/76844* (2013.01); *H01L 21/76855* (2013.01); *H01L 29/41775* (2013.01); *H01L 29/6659* (2013.01); *H01L 2924/0002* (2013.01)

(58) Field of Classification Search
USPC ........... 438/675, 98, 233, 256, 399, 523, 533, 438/558, 571, 586, 666
See application file for complete search history.

(56) References Cited

U.S. PATENT DOCUMENTS

| 6,323,519 B1 * | 11/2001 | Gardner | H01L 21/2652 257/336 |
| 6,730,570 B2 * | 5/2004 | Shin | H01L 21/76831 257/346 |
| 7,087,515 B2 * | 8/2006 | Ahn | H01L 21/02063 257/E21.577 |

(Continued)

FOREIGN PATENT DOCUMENTS

| CN | 101790778 | 7/2010 |
| CN | 102044424 | 5/2011 |

(Continued)

OTHER PUBLICATIONS

Office Action regarding Korean Patent Application No. 10-2011-0112996, dated Nov. 12, 2012, 18 pages.

(Continued)

*Primary Examiner* — Jaehwan Oh
(74) *Attorney, Agent, or Firm* — Slater & Matsil, L.L.P.

(57) ABSTRACT

A system and method for forming and using a liner is provided. An embodiment comprises forming an opening in an inter-layer dielectric over a substrate and forming the liner along the sidewalls of the opening. A portion of the liner is removed from a bottom of the opening, and a cleaning process may be performed through the liner. By using the liner, damage to the sidewalls of the opening from the cleaning process may be reduced or eliminated. Additionally, the liner may be used to help implantation of ions within the substrate.

20 Claims, 6 Drawing Sheets

(56) References Cited

U.S. PATENT DOCUMENTS

| | | | |
|---|---|---|---|
| 7,220,668 B2 * | 5/2007 | Park | H01L 21/02063 257/E21.241 |
| 7,348,283 B2 | 3/2008 | Leu et al. | |
| 7,679,192 B2 * | 3/2010 | Lee | H01L 21/76831 257/369 |
| 8,304,819 B2 * | 11/2012 | Jung | H01L 21/28512 257/181 |
| 8,492,217 B2 * | 7/2013 | Frohberg | H01L 29/665 257/E21.214 |
| 2004/0056281 A1 | 3/2004 | Shin et al. | |
| 2004/0121590 A1 * | 6/2004 | Moon | H01L 21/76897 438/639 |
| 2005/0020093 A1 * | 1/2005 | Ahn | H01L 21/02063 438/782 |
| 2005/0026380 A1 * | 2/2005 | Kammler | H01L 29/665 438/305 |
| 2006/0141712 A1 * | 6/2006 | Chun | H01L 29/4236 438/270 |
| 2006/0166494 A1 * | 7/2006 | Lee | H01L 21/76802 438/639 |
| 2007/0042580 A1 | 2/2007 | Al-Bayati et al. | |
| 2007/0141798 A1 * | 6/2007 | Bohr | H01L 21/28079 438/301 |
| 2009/0134497 A1 * | 5/2009 | Barth | H01L 21/76898 257/621 |
| 2011/0084320 A1 * | 4/2011 | Jung | H01L 21/28512 257/288 |
| 2012/0202326 A1 * | 8/2012 | Kronholz | H01L 21/31111 438/231 |
| 2012/0248550 A1 | 10/2012 | Huang et al. | |
| 2014/0015104 A1 | 1/2014 | Su et al. | |

FOREIGN PATENT DOCUMENTS

| | | |
|---|---|---|
| KR | 20040026334 | 3/2004 |
| KR | 20040026334 A | 3/2004 |
| KR | 20060074127 | 7/2006 |
| KR | 20060074127 A | 7/2006 |
| KR | 20110023001 | 3/2011 |
| KR | 20110023001 A | 3/2011 |
| KR | 20110040470 | 4/2011 |
| KR | 20110040470 A | 4/2011 |

OTHER PUBLICATIONS

Zhao, C., "A DRAM Compatible Cu Contact Using Self-Aligned Ta-silicide and Ta-barrier," Microelectronic Engineering 85 (2008), Elsevier B.V., pp. 2009-2012.

* cited by examiner

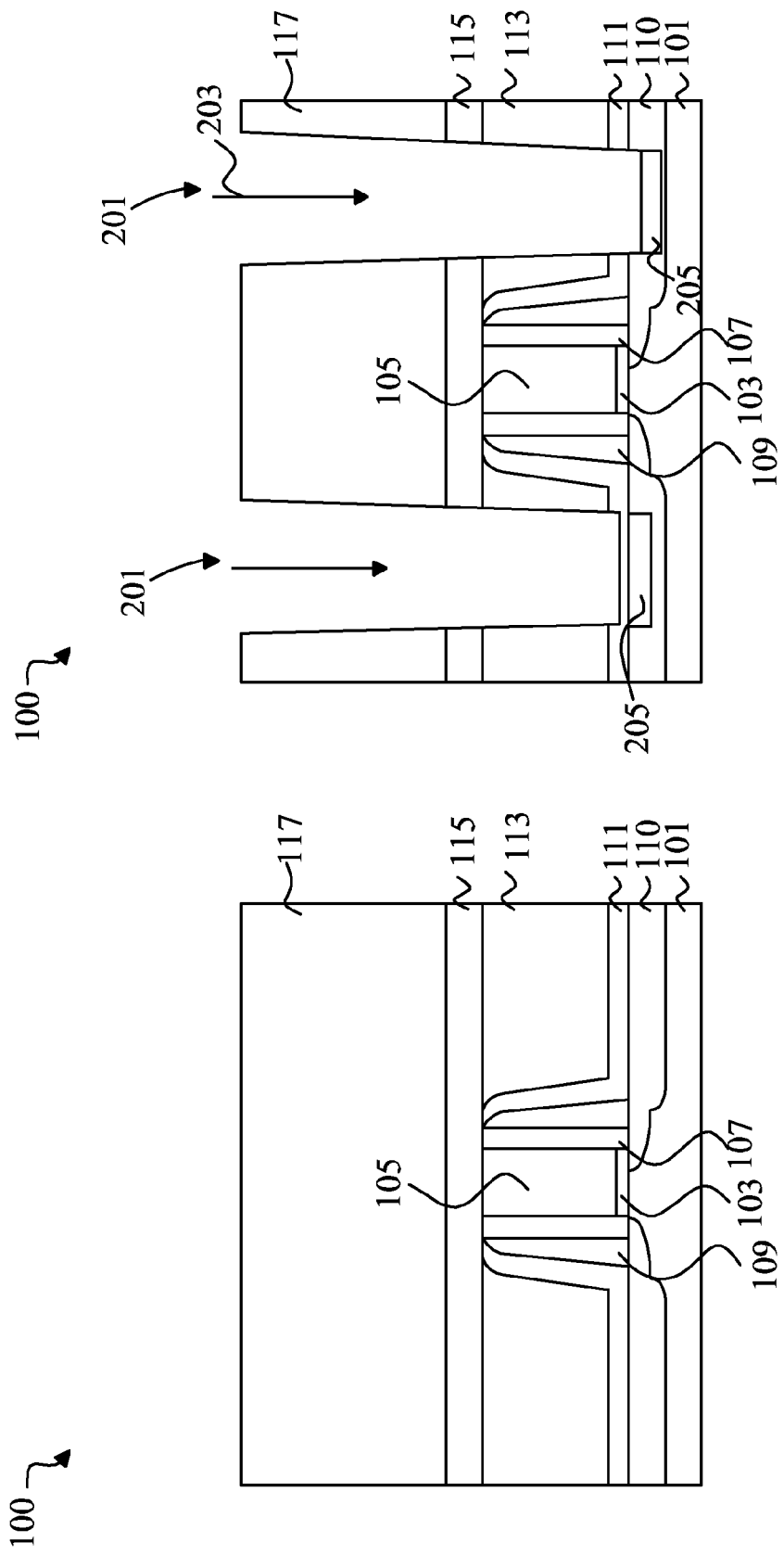

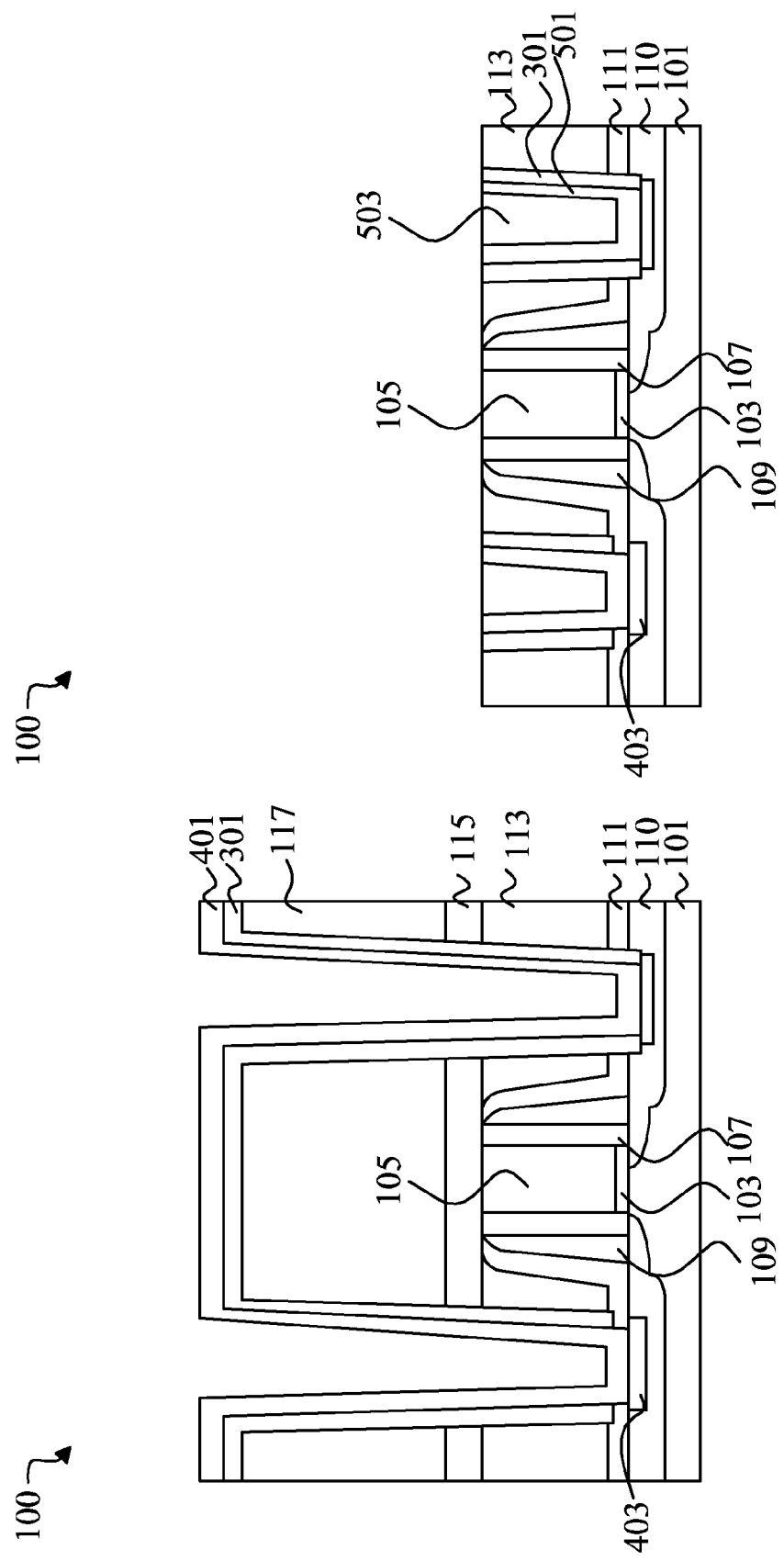

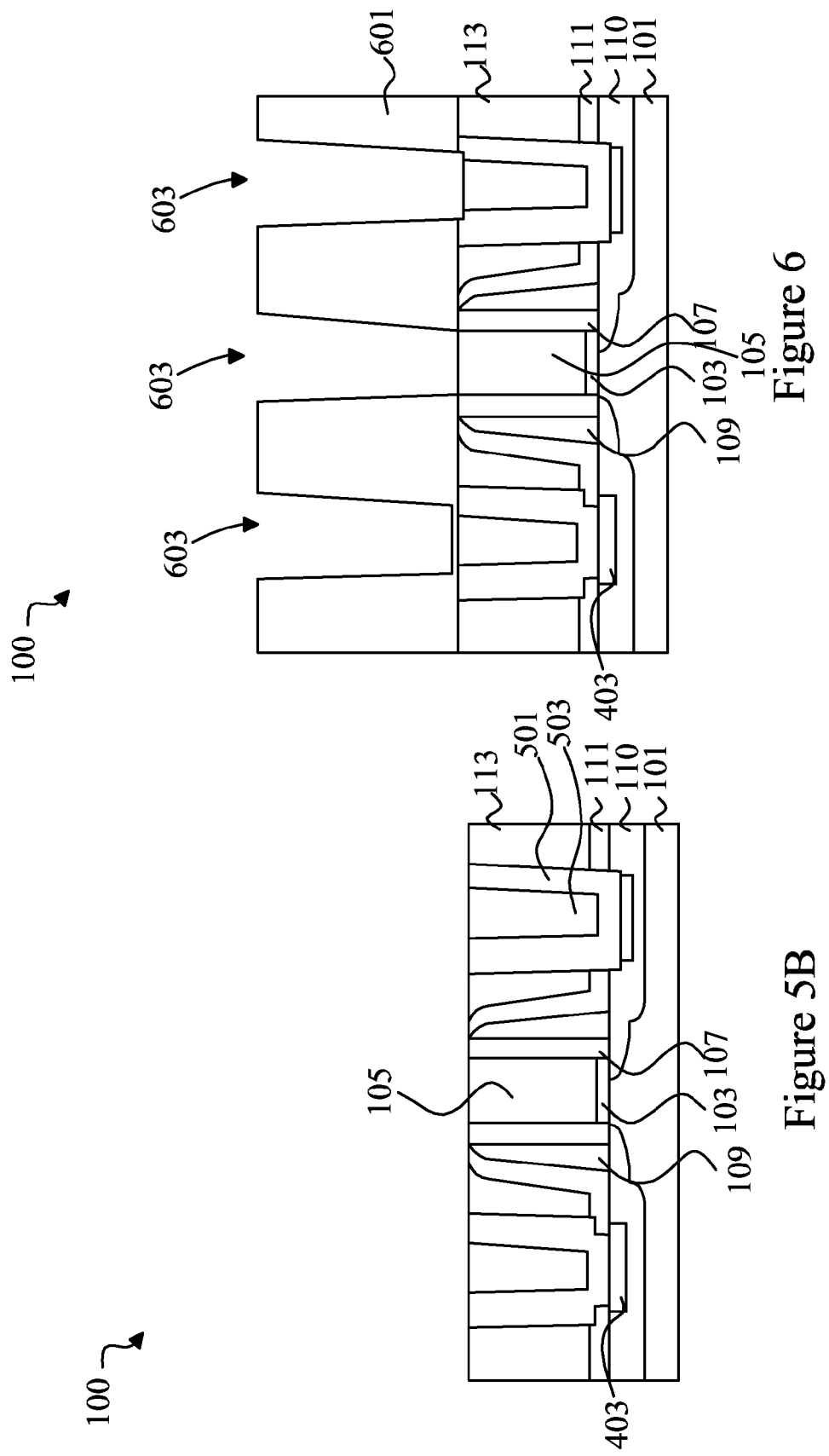

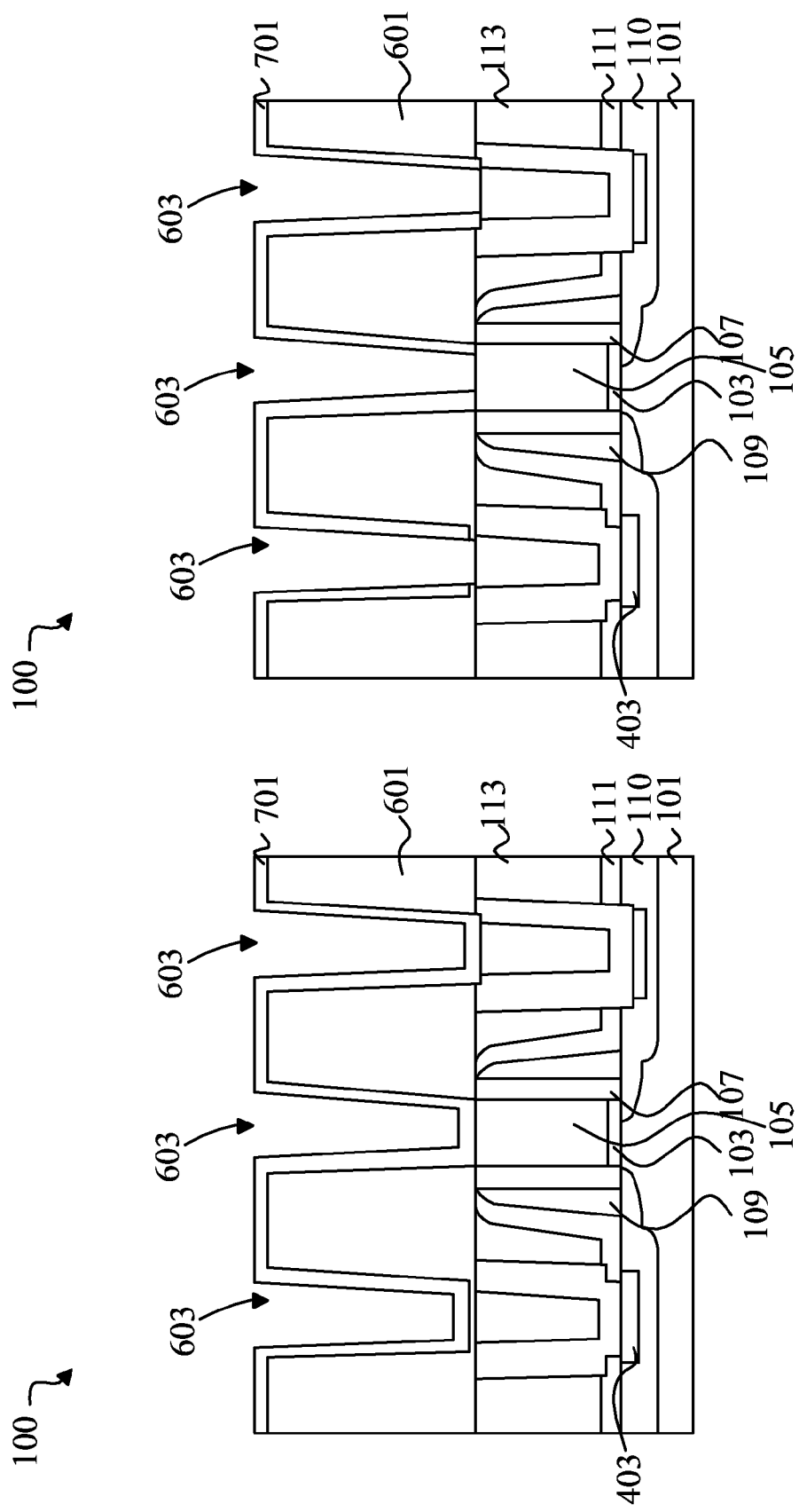

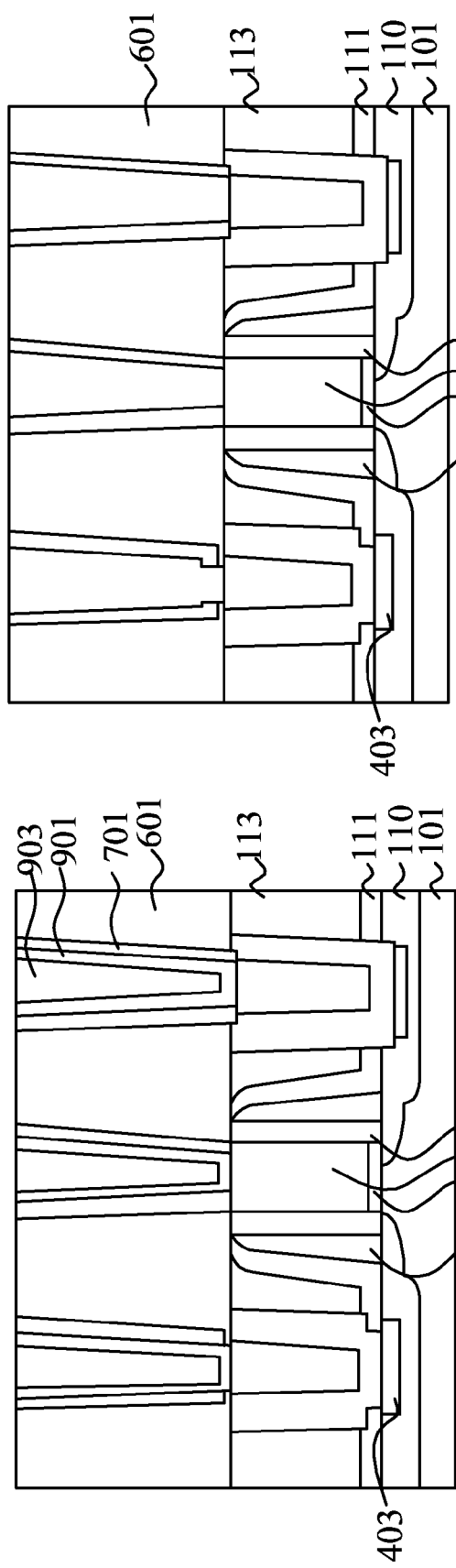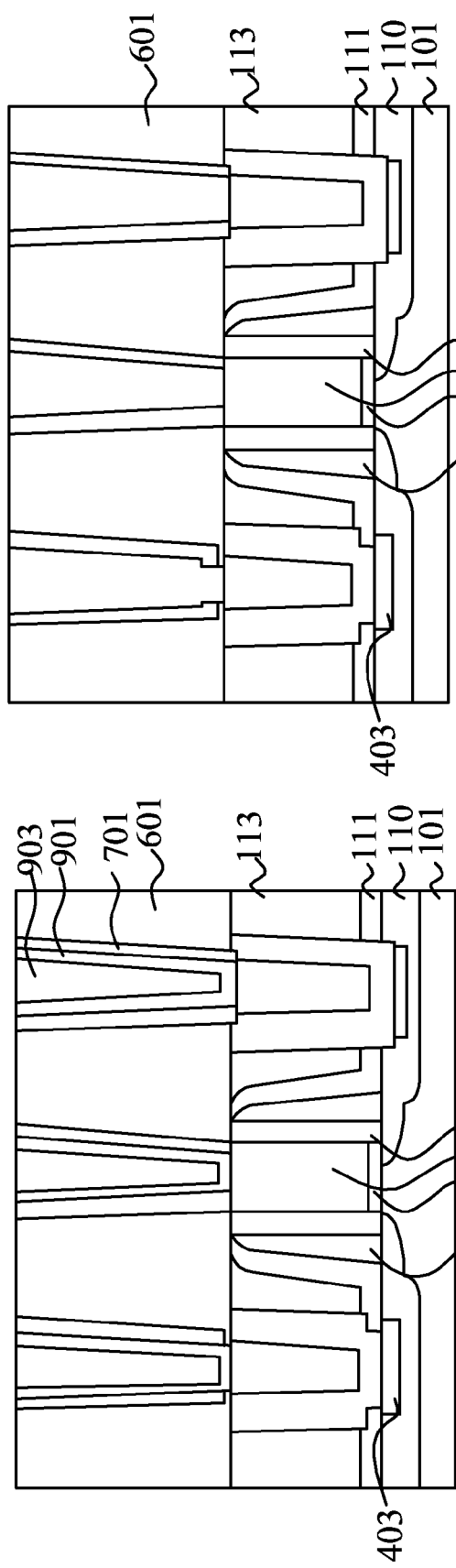

SEMICONDUCTOR DEVICE AND METHOD FOR FORMING THE SAME

BACKGROUND

Generally, contacts to sources and drains to active devices may be made through an inter-layer dielectric (ILD) formed to help electrically isolate the active devices from overlying metallization layers. These contacts may be made by forming an opening through the ILD in order to expose those portions of the substrate to which the contacts are desired to be formed, and then forming a self-aligned silicide (otherwise known as a salicide). The salicide may be formed by forming a metal layer in the opening and against the substrate and then annealing the metal layer and substrate in order to form the salicide. Excess metal may then be removed, thereby leaving the salicide, and contacts may be formed in connection with the salicide.

To aid in the process of forming the salicide, a pre-clean may be performed on the openings prior to the formation of the metal layer within the openings. This pre-clean has historically been performed using either a directional physical bombardment using, e.g., argon, krypton, or xenon ions. However, directional physical bombardment can damage the opening's profile, leading to such damage as chopping (a disfigurement of the sidewall of the opening along the top of the opening) and bowing (a disfigurement of the sidewalls of the opening along the sidewalls of the opening). Additionally, the directional physical bombardment may cause damage to the bottom of the opening, thereby leading to an uncontrolled salicide formation.

Alternatively, an in-situ chemical pre-clean using, e.g., an etchant may be utilized. However, while the chemical pre-clean can reduce or eliminate some of the drawbacks associated with directional physical bombardment, the chemical pre-clean may also cause the opening to enlarge due to the isotropic etching of the opening. This enlargement of the opening can lead to the opening failing to meet the critical dimensions (CD) that may be desired or required for the contact, and may lead to the isolation of the contact plug to the metal gate.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates a semiconductor device with overlying dielectric layers in accordance with an embodiment;

FIG. 2 illustrates contact openings through the dielectric layers in accordance with an embodiment;

FIG. 4 illustrates the formation of a barrier layer over the liner in accordance with an embodiment;

FIGS. 5A-5B illustrate the filling of the contact openings in accordance with an embodiment;

FIG. 6 illustrates the formation of contact openings within an inter-layer dielectric overlying the semiconductor device in accordance with an embodiment;

FIG. 7 illustrates the formation of a second liner in accordance with an embodiment;

FIG. 8 illustrates the removal of the bottom of the second liner in accordance with an embodiment; and FIGS. 9A-9B illustrate the filling of the second contact openings in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figures 3A, 3B:
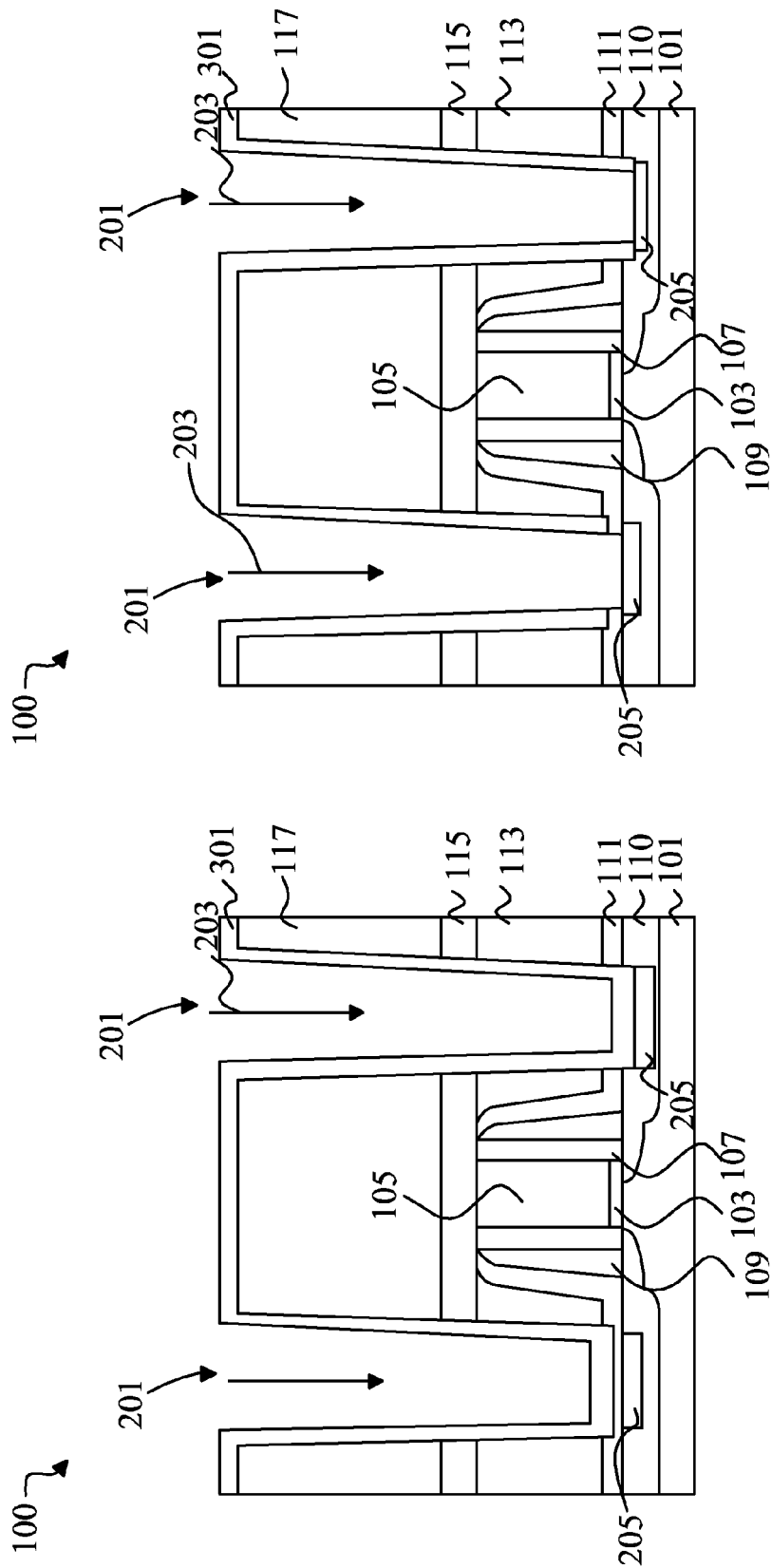
FIGS. 3A-3B illustrate the formation of a liner into the contact openings in accordance with an embodiment.

The making and using of embodiments are discussed in detail below. It should be appreciated, however, that the embodiments provides many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a protective liner utilized during formation of a contact. The embodiments may also be applied, however, to other liners used with other electrical connections.

With reference now to FIG. 1, there is shown a semiconductor device 100 in accordance with an embodiment. The semiconductor device 100 may comprise a substrate 101, a gate dielectric 103, a gate electrode 105, a spacer liner 107, spacers 109, source/drain regions 110, a first contact etch stop layer (CESL) 111, a first interlayer dielectric layer (ILD) 113, a second CESL 115, and a second ILD 117. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Gate dielectric 103 and gate electrode 105 may be formed and patterned on the substrate 101 by any suitable process known in the art. The gate dielectric 103 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. In an embodiment the gate dielectric 103 may have a relative permittivity value greater than about 4.

In an embodiment in which the gate dielectric 103 comprises an oxide layer, the gate dielectric 103 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor.

In one embodiment, the gate dielectric 103 may be between about 8 Å to about 50 Å in thickness, such as about 16 Å in thickness.

The gate electrode 105 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 105 is poly-silicon, the gate electrode 105 may be formed by depositing doped or undoped poly-silicon by low-pressure chemical vapor deposition (LPCVD) to a thickness in the range of about 100 Å to about 2,500 Å, such as about 1,500 Å.

Once the gate electrode 105 and gate dielectric 103 have been formed, the gate electrode 105 and the gate dielectric 103 may be patterned. The patterning may be performed by first depositing and then patterning a photoresist layer (not shown) over the gate electrode 105. Those portions of the gate electrode 105 and the gate dielectric 103 that are not covered by the patterned photoresist layer may then be removed through a process such as an etch until the substrate 101 is substantially exposed.

Optionally, the spacer liner 107 may be formed on the sidewalls of the gate dielectric 103 and the gate electrode 105 in order to further isolate the gate electrode 105. In an embodiment in which the gate electrode 105 is polysilicon, the spacer liner 107 may be an oxide, and may be formed through an oxidation process such as a wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. Alternatively, the spacer liner 107 may be formed of other materials, such as silicon nitride, and may be formed of other processes, such as CVD, PVD, and the like.

Spacers 109 may be formed on the sidewalls of the gate dielectric 103 and the gate electrode 105. The spacers 109 are typically formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 109, such as by anisotropically etching to remove the spacer layer from the horizontal surfaces of the structure.

Source/drain regions 110 are formed in the substrate 101 on opposing sides of the gate dielectric 103. In an embodiment in which the substrate 101 is an n-type substrate, the source/drain regions 110 may be formed by implanting appropriate p-type dopants such as boron, gallium, indium, or the like. Alternatively, in an embodiment in which the substrate 101 is a p-type substrate, the source/drain regions 110 may be formed by implanting appropriate n-type dopants such as phosphorous, arsenic, or the like. These source/drain regions 110 are implanted using the gate dielectric 103, gate electrode 105 and the spacers 109 as masks.

It should be noted that one of ordinary skill in the art will realize that many other processes, steps, or the like may be used to form these source/drain regions 110. For example, one of ordinary skill in the art will realize that a plurality of implants may be performed using various combinations of spacers and liners to form source/drain regions having a specific shape or characteristic suitable for a particular purpose. Any of these processes may be used to form the source/drain regions 110, and the above description is not meant to limit the embodiments to the steps presented above.

The first CESL 111 may be formed over the substrate 101 and the spacers 109. The first CESL 111 may be used to protect the substrate 101, the gate electrode 105, and the spacers 109 from damage caused by further processing, provide for a control point for further etching processes, and may also be alternatively used to create strain in the channel region of the devices in order to promote better efficiency. In one embodiment, the first CESL 111 may be formed of silicon nitride using plasma enhanced chemical vapor deposition (PECVD). Other materials such as nitride, oxynitride, carbide, boride, combinations thereof, or the like, and alternative techniques of forming the first CESL 111, such as low pressure CVD (LPCVD), could alternatively be used. The first CESL 111 may have a thickness of between about 50 Å and about 2,000 Å, such as about 700 Å. Optionally, and as illustrated in FIG. 1, the first CESL 111 may be planarized using, e.g., a chemical mechanical polishing (CMP) process in order to planarize the first CESL 111 and expose the gate electrode 105.

The first ILD 113 may be formed over the first CESL 111 in order to provide further electrical isolation between the source/drain regions 110 and overlying metallization layers (not shown). The first ILD 113 may be formed by chemical vapor deposition, sputtering, or any other methods known and used in the art for forming an ILD. The first ILD 113 may have a planarized surface and may be comprised of doped or undoped silicon oxide, silicon nitride doped silicate glass, other high-k materials, combinations of these, or the like, could alternatively be utilized. After formation, the first ILD 113 may be planarized using, e.g., a CMP process in order to planarize the first ILD 113 and again expose the gate electrode 105.

The second CESL 115 may be formed over the first ILD 113 and the gate electrode 105. The second CESL 115 may be used to protect the devices from damage caused by further processing and to provide for a stopping control point for etching. In one embodiment, the second CESL 115 may be formed of silicon nitride using plasma enhanced chemical vapor deposition (PECVD). Other materials such as nitride, carbide, boride, oxynitride, combinations thereof, or the like, and alternative techniques of forming the second CESL 115, such as low pressure CVD (LPCVD) or PVD, could alternatively be used. The second CESL 115 may have a thickness of between about 50 Å and about 2,000 Å, such as about 300 Å.

The second ILD 117 may be formed over the second CESL 115. The second ILD 117 may be formed by chemical vapor deposition, sputtering, or any other methods known and used in the art for forming an ILD. The second ILD 117 may have a planarized surface and may be comprised of silicon oxide, although other materials, such as other low-k materials, could alternatively be utilized. The second ILD 117 may be formed to a thickness of between about 50 Å and about 2000 Å, such as about 500 Å.

FIG. 2 illustrates the formation of contact openings 201 through the second ILD 117, the second CESL 115, and the first ILD 113. Additionally, the contact openings 201 may be formed to extend either into the first CESL 111 (as illustrated on the left side of FIG. 2) or through the first CESL 111 to expose or partially extend into the substrate 101 (as illustrated on the right side of FIG. 2). While both of these alternatives are illustrated in FIG. 2, it should be understood that the processing to form the contact openings 201 may be used to form the contact openings 201 to equal depths as well, and the illustration of both depths, while remaining within the scope of the embodiments, is illustrated in FIG. 2 as separate depths for convenience.

The contact openings 201 may be formed through a series of sequential etchings using a suitable photolithographic process. Generally, photolithographic techniques involve depositing a photoresist material, which is exposed and developed to expose portions of the second ILD 117 that are to be removed. The remaining photoresist material protects the underlying material from subsequent processing steps, such as etching. In an embodiment photoresist material is utilized to create a patterned mask to define the contact openings 201, but additional masks, such as a hardmask, may also be used. The etching process may be an anisotropic or isotropic etch process, such as an anisotropic dry etch process. In an embodiment, multiple etch processes using a suitable etchant or combination of etchants may be sequentially performed through the second ILD 117, the second CESL 115, the first ILD 113, and either into or through the first CESL 111.

FIG. 2 additionally illustrates an implantation process 203 to form implantation regions 205 within the source/drain regions 110. The implantation process 203 may implant ions either through the first CESL 111 (as illustrated on the left side of FIG. 2) or directly into the source/drain regions 110 (as illustrated on the right side of FIG. 2). The implantation process 203 may implant ions such as silicon, germanium, xenon, carbon, fluorine, nitrogen, boron, phosphorous, chlorine, sulfur, bromine, aluminum, platinum, indium, combinations of these, or the like, to a concentration higher than the surrounding source/drain regions 110. For example, the implantation process 203 may implant an additional concentration of ions (over the concentration of ions already within the source/drain regions 110) of less than about 9E21 atoms/cm$^3$, such as about 2E20 atoms/cm$^3$. The implantation of the ions may be used to either recrystallize the implantation regions 205 or to form an amorphous region within the implantation regions 205, and may be used to specifically tune the performance of the semiconductor device 100 or to control the morphology of the salicide (not shown in FIG. 2 but illustrated and discussed below with respect to FIG. 4).

FIG. 3A illustrates the formation of a liner 301 along the sidewalls and bottoms of the contact openings 201. The liner 301 may be utilized to absorb damage from further processing (described further below) so that the sidewalls of the contact openings 201 are not damaged and the contact openings 201 are not expanded beyond the critical dimensions. The liner 301 may be formed of a material that is resistant to being removed by a cleaning process (discussed below) and may be, e.g., silicon nitride although other material such as silicon oxide, silicon carbide, silicon boride, other organic layers, combinations of these, and the like may alternatively be used. The liner 301 may be formed using a CVD process, although other process such as ALD, PVD, a spin-on process, or a passivate process during the contact etch may alternatively be used. The liner 301 may be formed to a thickness of between about 10 Å and about 1000 Å, such as about 500 Å.

Optionally, the liner 301 may be doped in order to enhance its properties, such as its resistance to certain etchants. In an embodiment, the liner 301 may be doped with carbon atoms, nitrogen atoms, fluorine atoms, hydrogen atoms, boron atoms, combinations or these, or the like. This doping may be performed to adjust the physical properties of the liner 301 or may even be used to change the material of the liner 301. For example, in an embodiment in which the liner 301 is originally silicon nitride, the liner 301 may be doped with carbon atoms to a concentration sufficient to change the silicon nitride to silicon carbide. Accordingly, the liner 301 may be doped to a concentration of between about 0% and about 66%, such as about 17%. The liner 301 may be doped in-situ as the liner 301 is being formed or may alternatively be doped through an implantation process after the liner 301 has been initially formed.

FIG. 3A additionally illustrates an embodiment in which the implantation process 203 is delayed until after the liner 301 has been formed. In this embodiment the implantation process 203 may implant ions through the liner 301 and either through the first CESL 111 (as illustrated on the left side of FIG. 3A) or into the source/drain regions 110 (as illustrated on the right side of FIG. 3A). Similar to performing the implantation process 203 prior to forming the liner 301, the implantation process 203 performed after the formation of the liner 301 may implant ions such as silicon, germanium, xenon, carbon, fluorine, nitrogen, boron, phosphorous, chlorine, sulfur, bromine, aluminum, platinum, indium, combinations of these, or the like, to a concentration higher than the surrounding source/drain regions 110. For example, in this embodiment the implantation process 203 may implant an additional concentration of ions (over the concentration of ions already within the source/drain regions 110) of less than about 9E21 atoms/cm$^3$ such as about 2E20 atoms/cm$^3$. The implantation of the ions after the formation of the liner 301 may be used to either recrystallize the implantation regions 205 or to form an amorphous region within the implantation regions 205, and may be used to specifically tune the performance of the semiconductor device 100 or to control the morphology of the salicide (not shown in FIG. 3A but illustrated and discussed below with respect to FIG. 4).

FIG. 3B illustrates an alternative embodiment in which the liner 301 is formed and then a bottom of the liner 301 is removed prior to the implantation process 203. In this embodiment the bottom of the liner 301 may be removed using, e.g., a plasma or non-plasma etching process, using, e.g., an etchant that may contain argon, carbon, hydrogen, nitrogen, oxygen, cobalt, or fluorine atoms. For example, in an embodiment a plasma etch may use the etchant fluorine in order to expose the underlying source/drain regions 110 by removing either the liner 301 and the first CESL 111 (as illustrated on the left hand side of FIG. 3B), by removing the liner 301 by itself (as illustrated on the right hand side of FIG. 3B), or by conditioning the liner 301 to prepare it for a subsequent cleaning process (discussed further below). The process parameters of the etching process may be adjusted in order to remove only the bottom of the liner 301 with minimal removal of the liner 301 along the sidewalls. Once the source/drain regions 110 have been exposed, the implantation process 203 described above with respect to FIG. 3A may be performed in order to form the implantation regions 205 within the source/drain regions 110.

However, as one of ordinary skill in the art will recognize, the precise processes, materials, etchants, and order of steps described above is intended to be merely illustrative and is not intended to be limiting to the embodiments. For example, any suitable etchants or combination of etchants, and any suitable order of process steps, may alternatively be utilized. These and any other suitable processes, etchants, and order are fully intended to be included within the scope of the embodiments.

In either embodiment illustrated in either FIG. 3A or FIG. 3B, once the liner 301 has been removed from the bottom of the contact openings 201, a pre-clean may be performed on the exposed portions of the source/drain regions 110. In an embodiment, the pre-clean may be a chemical etch process in which the source/drain regions 110 are exposed to an etchant using either a plasma or non-plasma process. The etchant may be, e.g., a nitrogen or fluorine containing etchant, such as $NF_3$ or $NH_3$, although any suitable etchant may alternatively be utilized, and may be exposed for a time of between about 1 seconds and about 500 seconds, such as about 50 seconds.

With the liner 301 being present during the pre-clean and also being resistant to the etching process utilized for the pre-clean, the liner 301 may be utilized to prevent damage to the sidewalls of the contact openings 201, thereby preventing the bowing and chopping of the contact openings 201 that may otherwise occur. Additionally, in an embodiment in which the pre-clean utilizes the chemical etch process, by protecting the sidewalls of the contact openings 201, the liner 301 can help prevent the widening of the contact openings 201, thereby helping the contact openings 201 meet the critical dimensions.

Optionally, after the liner 301 has been used to protect the sidewalls of the contact openings 201, the liner 301 may be etched after the pre-clean in order to reduce the thickness of the liner 301 in preparation for the formation of silicide regions 403 (discussed further below with respect to FIG. 4). In an embodiment the liner 301 may be wet etched using a suitable etchant that is selective to the liner 301, such as $NF_3$ or $NH_3$, for a time period of between about 1 second and about 500 seconds, such as about 50 seconds. By etching the liner 301, the thickness of the liner 301 may be reduced to between about 1 Å and about 1000 Å, such as about 500 Å. Alternatively, the liner 301 may be completely removed from the sidewalls of the contact openings 201.

FIG. 4 illustrates that, after the bottom of the liner 301 has been removed and the implantation regions 205 have been formed (as described above with respect to either FIG. 3A or 3B), a metal layer 401 may be formed in the contact openings 201 and in contact with the exposed portions of the source/drain regions 110, and silicide regions 403 may be formed within the source/drain regions 110. The metal layer 401 may be blanket deposited into the contact openings 201 using a deposition process such as CVD, PVD, or the like, and may comprise metals such as nickel, cobalt, titanium, tantalum, platinum, tungsten, other noble metals, other refractory metals, rare earth metals or their alloys.

Optionally, the metal layer 401 may be doped in order to introduce dopants into the silicide regions 403. In an embodiment the metal layer 401 may be doped by one or more dopants such as boron, phosphorous, chlorine, sulfur, oxygen, nitrogen, fluorine, carbon, bromine, aluminum, germanium, silicon, platinum, xenon, indium, iodine, combinations of these, or the like. Additionally, the metal layer 401 may be doped either in-situ as the metal layer 401 is being formed, or alternatively, doped through an implantation process after the metal layer 401 has already been formed.

After the metal layer 401 has been formed, the silicide regions 403 may be formed by a first rapid thermal anneal to react the metal in the metal layer 401 with the substrate 101 in order to form the silicide regions 403. The first rapid thermal anneal may be performed at a temperature of between about 100° C. and about 1200° C., such as about 400° C., for a time period of between about 0.0001 seconds and about 1800 seconds, such as about 20 seconds. Once the silicide regions 403 have been formed, the unreacted metal in the metal layer 401 may be removed using a suitable etchant that is selective to the unreacted metal, and a second rapid thermal anneal may be performed in order to change the phase of the silicide regions 403 and lower its resistance.

However, as one of ordinary skill in the art will recognize, the above described process for forming the silicide regions 403 is merely an illustrative embodiment and is not meant to limit the embodiments in any fashion. Alternative methods of forming the silicide regions 403, such as using multiple thermal treatments beyond the second rapid thermal anneal, or forming dual silicide regions with different materials, may also be utilized. These and any other suitable method of forming the silicide regions 403 are fully intended to be included within the scope of the embodiments.

After the unreacted metal in the metal layer 401 has been removed to expose the silicide regions 403, the exposed silicide regions 403 may optionally be cleaned. The cleaning process may be a plasma or non-plasma etch process in which the silicide regions 403 are etched without being completely removed. In an embodiment an etchant that contains argon, nitrogen, fluorine, helium, or hydrogen, carbon, oxygen, such as argon, may be utilized to clean the exposed silicide regions 403. For example, the silicide regions 403 may be etched using argon for a time of between about 1 seconds and about 300 seconds, such as about 30 seconds.

Optionally, if the liner 301 has not been fully removed by this step, the liner 301 may again be etched in order to reduce the thickness of the liner 301 in preparation for the filling of the contact openings 201 (discussed further below with respect to FIG. 5). For example, the liner 301 may be wet etched using a suitable etchant, such as $NF_3$ or $NH_3$, for a time period of between about 1 second and about 500 seconds, such as about 50 seconds. By etching the liner 301, the thickness of the liner 301 may be reduced to a thickness of less than about 1000 Å, such as about 500 Å. Alternatively, the liner 301 may be completely removed from the sidewalls of the contact openings 201 at this point.

FIG. 5A illustrates the formation of a barrier layer 501 and the filling of the contact openings 201 with a conductive material 503. In an embodiment, the barrier layer 501 may be formed of one or more layers of titanium, titanium nitride, tantalum, tantalum nitride, tungsten nitride, ruthenium, rhodium, platinum, other noble metals, other refractory metals, their nitrides, combinations of these, or the like. The barrier layer 501 may be formed through chemical vapor deposition, although other techniques such as PVD or ALD could alternatively be used. The barrier layer 501 may be formed to a thickness of about 5 Å to about 500 Å.

After the barrier layer 501 has been formed, the conductive material 503 may be formed to fill the contact openings 201. The conductive material 503 may be formed be initially forming a seed layer (not individually shown in FIG. 5) over the barrier layer 501. The seed layer may be deposited by PVD, ALD or CVD, and may be formed of tungsten, copper, or copper alloys, although other suitable methods and materials may alternatively be used if desired. Additionally, while the thickness of the seed layer will be dependent at least in part on the depth of the contact openings 201, the seed layer may have a thickness of between about 5 Å and about 1,000 Å.

Once the seed layer has been formed, the conductive material 503 may be formed onto the seed layer. The conductive material 503 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. The conductive material 503 may be formed by electroplating the conductive material 503 onto the seed layer, filling and overfilling the contact openings 201.

Optionally, the conductive material 503 may be doped with dopants in order to enhance device performance, such as the RC delay. In an embodiment the conductive material 503 may be doped with dopants such as boron, phosphorous, chlorine, sulfur, oxygen, nitrogen, fluorine, carbon, bromine, indium, iodine, combinations of these, and the like. Additionally, the conductive material 503 may be doped either in-situ as the conductive material 503 is being plated or may be doped through an implantation process after the conductive material 503 has been formed.

Once the contact openings 201 have been filled, excess liner 301, barrier layer 501, seed layer, and conductive material 503 outside of the contact openings 201 may be removed through a planarization process such as chemical mechanical polishing (CMP), although any suitable removal process may be used. If desired, the second ILD 117 and the second CESL 115 may also be fully or partially removed through the CMP process.

FIG. 5B illustrates an alternative embodiment in which the liner 301 has been completely removed prior to the formation of the barrier layer 501 and the conductive material 503. As can be seen, the barrier layer 501 in this embodiment may line the sidewalls of the contact openings 201 and the conductive material 503 may fill the remainder of the contact openings 201. By removing the liner 301, all of the damage from the various cleanings may be removed, thereby leaving an undamaged and unenlarged sidewall for the contact openings 201.

FIG. 6 illustrates the formation of a third ILD 601 over the gate electrode 105, the first ILD 113, and the conductive material 503. The third ILD 601 may be formed by chemical vapor deposition, sputtering, or any other methods known and used in the art for forming an ILD. The third ILD 601 may have a planarized surface and may be comprised of silicon oxide, although other materials, such as other low-k materials, could alternatively be utilized. The third ILD 601 may be formed to a thickness of between about 100 Å and about 1000 Å, such as about 500 Å.

FIG. 6 also illustrates the formation of second contact openings 603 either partially through the third ILD 601 (as illustrated in the left one of the second contact openings 603 in FIG. 6), completely through the third ILD 601 (as illustrated in the center one of the second contact openings 603 in FIG. 6), or through the ILD 601 and partially into the conductive material 503 (as illustrated in the right one of the second contact openings 603 in FIG. 6). Again, while multiple alternatives are illustrated in FIG. 2, it should be understood that the processing to form the second contact openings 603 may be used to form the contact openings to equal depths as well, and the illustration of three depths, while remaining within the scope of the embodiments, is illustrated in FIG. 6 as separate depths for convenience.

The second contact openings 603 may be formed through a suitable etching process utilizing, e.g., a suitable photolithographic and etching process. For example, a photoresist material may be deposited or formed on the third ILD 601, and the photoresist material is exposed and developed to expose portions of the third ILD 601 that are to be removed. The remaining photoresist material protects the underlying material from subsequent processing steps, such as etching. In an embodiment photoresist material is utilized to create a patterned mask to define the second contact openings 603, but additional masks, such as a hardmask, may also be used. The etching process may be an anisotropic or isotropic etch process, such as an anisotropic dry etch process, and may continue until the desired depth has been reached.

FIG. 7 illustrates the formation of a second liner 701 into the second contact openings 603. The second liner 701 may be utilized to absorb damage from further processing (described further below) so that the sidewalls of the second contact openings 603 are not damaged. The second liner 701 may be formed of a material that is resistant to a pre-clean etchant, and may be, e.g., silicon nitride although other material such as silicon oxide, silicon carbide, silicon boride, other organic layers, combinations of these, and the like. The second liner 701 may be formed using a CVD process, although other processes such as ALD, PVD or a spin-on process may alternatively be used. The second liner 701 may be formed to a thickness of between about 5 Å and about 1000 Å, such as about 500 Å.

Optionally, the second liner 701 may be doped in order to enhance its properties, such as its resistance to certain etchants. This doping may be performed to adjust the physical properties of the second liner 701 or may even be used to change the material of the second liner 701. For example, in an embodiment in which the second liner 701 is originally silicon nitride, the second liner 701 may be doped with carbon atoms to a concentration sufficient to change the silicon nitride to silicon carbide. Accordingly, the second liner 701 may be doped to a concentration of between about 0% and about 66%, such as about 17%. The second liner 701 may be doped in-situ as the second liner 701 is being formed or may alternatively be doped through an implantation process after the second liner 701 has been initially formed.

FIG. 8 illustrates a removal of the bottom of the second liner 701. In an embodiment the bottom of the second liner 701 may be may be removed using, e.g., a plasma or non-plasma etching process, using, e.g., an etchant that may contain argon, carbon, hydrogen, nitrogen, oxygen, or fluorine atoms. For example, in an embodiment a plasma etch may use the etchant argon in order to expose the underlying conductive material 503 or gate electrode 105 by removing either the second liner 701 and the third ILD 601 (as illustrated on the left hand side of FIG. 8), by removing the second liner 701 by itself (as illustrated in the middle of FIG. 8), or by removing the second liner 701 and a portion of the conductive material 503 (as illustrated on the right hand side of FIG. 8).

Once the second liner 701 has been removed from the bottom of the second contact openings 603, a second pre-clean may be performed on the exposed portions of the conductive material 503 and the gate electrode 105. In an embodiment, the second pre-clean may be similar to the pre-clean and may be a chemical etch process in which the conductive material 503 and the gate electrode 105 are exposed to an etchant using either a plasma or non-plasma process. The etchant may be, e.g., a nitrogen or fluorine containing etchant, such as $NH_3$ or $NF_3$, although any suitable etchant may alternatively be utilized, and may be exposed for a time of between about 1 seconds and about 500 seconds, such as about 50 seconds.

With the second liner 701 being resistant to the etching process utilized for the second pre-clean and being present during the second pre-clean, the second liner 701 may be utilized to prevent damage to the sidewalls of the second contact openings 603, thereby preventing the bowing and chopping of the second contact openings 603 that may otherwise occur. Additionally, in an embodiment in which the second pre-clean utilizes the chemical etch process, by protecting the sidewalls of the second contact openings 603, the second liner 701 can help prevent the widening of the second contact openings 603, thereby helping the second contact openings 603 meet the desired critical dimensions.

Further, the second liner 701 may optionally be etched after the second pre-clean in order to reduce the thickness of the second liner 701. The second liner 701 may be wet etched using a suitable etchant, such as $NF_3$ or $NH_3$, for a time period of between about 1 second and about 500 seconds, such as about 50 seconds. By etching the second liner 701, the thickness of the second liner 701 may be reduced to less than about 500 Å, such as about 100 Å. Alternatively, the second liner 701 may be completely removed from the sidewalls of the second contact openings 603.

FIG. 9A illustrates the formation of a second barrier layer 901 and second conductive material 903 in the second contact openings 603. In an embodiment the second barrier layer 901 may be formed of one or more layers of titanium, titanium nitride, tantalum, tantalum nitride, tungsten nitride, ruthenium, rhodium, platinum, other noble metals, other refractory metals, their nitrides, combinations of these, or the like. The second barrier layer 901 may be formed through chemical vapor deposition, although other techniques such as PVD or ALD could alternatively be used. The second barrier layer 901 may be formed to a thickness of about 5 Å to about 500 Å.

After the second barrier layer 901 has been formed, the second conductive material 903 may be formed to fill the second contact openings 603. The second conductive material 903 may be formed be initially forming a second seed layer (not individually shown in FIG. 9A) over the second barrier layer 901. The second seed layer may be deposited by PVD or CVD, and may be formed of tungsten, copper, or copper alloy, although other methods and materials may alternatively be used if desired. Additionally, while the thickness of the second seed layer will be dependent at least in part on the depth of the second contact openings 603, the second seed layer may have a thickness of between about 5 Å and about 1,000 Å.

Once the second seed layer has been formed, the second conductive material 903 may be formed onto the second seed layer. The second conductive material 903 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. The second conductive material 903 may be formed by electroplating the second conductive material 903 onto the second seed layer, filling and overfilling the second contact openings 603.

Optionally, the second conductive material 903 may be doped with dopants in order to enhance device performance. In an embodiment the second conductive material 903 may be doped with dopants such as boron, phosphorous, chlorine, sulfur, oxygen, nitrogen, fluorine, carbon, bromine, indium, iodine, combinations of these, and the like. Additionally, the second conductive material 903 may be doped either in-situ as the second conductive material 903 is being plated or may be doped through an implantation process after the second conductive material 903 has been formed.

Once the second contact openings 603 have been filled and/or overfilled, excess second liner 701, second barrier layer 901, second seed layer, and second conductive material 903 outside of the second contact openings 603 may be removed in order to planarize the second liner 701, the second barrier layer 901, the second seed layer, and the second conductive material 903. The planarization may be performed through a planarization process such as chemical mechanical polishing (CMP), although any suitable removal process may be used.

By forming the second liner 701 within the second contact openings 603 and having the second liner 701 present during at least some of the processing, the second liner 701 may absorb damage that can occur during, e.g., the second pre-clean of the second contact openings 603. By preventing this damage, the second liner 701 can also prevent the second contact openings 603 from widening beyond their desired critical dimensions. Accordingly, contacts formed within the second contact openings 603 can be formed more reliably and with a greater control of their dimensions.

FIG. 9B illustrates an alternative embodiment in which the second liner 701 has been completely removed prior to the formation of the second barrier layer 901 and the second conductive material 903. As can be seen, the second barrier layer 901 lines the sidewalls of the second contact openings 603 and the second conductive material 903 fills the remainder of the second contact openings 603. By removing the second liner 701 all of the damage from the various cleanings may be removed without leaving damaged structures behind.

In accordance with an embodiment, a method for manufacturing semiconductor devices comprising forming a dielectric layer over a substrate and forming an opening through the dielectric layer, the opening comprising a bottom and sidewalls, is provided. A liner is formed along the sidewalls of the opening and the bottom of the opening, and a portion of the liner is removed along the bottom of the opening, thereby exposing a portion of the substrate. The substrate is cleaned with the liner in place along the sidewalls, and the opening is filled with a conductive material.

In accordance with yet another embodiment, a method for manufacturing a semiconductor device comprising forming a first opening in a first dielectric layer to expose a portion of a substrate and lining the first opening with a first liner is provided. A second opening is formed in the first liner to expose the portion of the substrate, and the portion of the substrate is cleaned. A silicide is formed along a surface of the portion of the substrate through the second opening, and a first conductive material is formed in the first opening and the second opening, the conductive material in contact with the silicide.

In accordance with yet another embodiment, a semiconductor device comprising a first inter-layer dielectric over a substrate is provided. The substrate comprises a silicide region and a source/drain region, the silicide region having a concentration of ions higher than the source/drain region. A first contact extends through the first inter-layer dielectric to make physical contact with the silicide region, the first contact comprising a barrier layer and a first conductive material. A first liner is located along sidewalls of the first contact but not located between the first contact and the silicide region.

Although the present embodiments and their advantages have been described in detail, it should be understood that various changes, substitutions and alterations can be made herein without departing from the spirit and scope of the embodiments. For example, the liner may be either removed from or left in the final product. Additionally, the liner may or may not be used as an implant mask to form implantation regions within the substrate.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for manufacturing semiconductor devices, the method comprising:
    forming a dielectric layer over a substrate;
    forming an opening through the dielectric layer, the opening comprising a bottom and sidewalls;
    forming a liner along the sidewalls of the opening and the bottom of the opening;
    removing a portion of the liner along the bottom of the opening, thereby exposing a portion of the substrate, wherein after the removing the portion of the liner along the bottom of the opening, a second portion of the liner remains over the dielectric layer;
    cleaning the substrate with the liner in place along the sidewalls;
    thinning the liner after the cleaning the substrate, wherein the thinning the liner is performed using a different process than the cleaning the substrate; and
    filling the opening with a conductive material.

2. The method of claim 1, further comprising forming a silicide along a surface the substrate, the forming the silicide occurring after the removing the portion of the liner and occurring prior to the filing the opening with a conductive material.

3. The method of claim 1, further comprising forming an implantation region within the substrate after the forming the opening and prior to the cleaning the substrate.

4. The method of claim 3, wherein the forming the implantation region is performed after the forming the liner and prior to the removing the portion of the liner.

5. The method of claim 3, wherein the forming the implantation region is performed after the removing the portion of the liner.

6. The method of claim 3, wherein the forming the implantation region implants ions within the substrate through only the liner.

7. The method of claim 3, wherein the forming the implantation region implants ions through the liner and an etch stop layer.

8. The method of claim 1, wherein the liner is removed from the sidewalls prior to the filling the opening with the conductive material.

9. A method for manufacturing a semiconductor device, the method comprising:
   forming a first opening in a first dielectric layer to extend into a contact etch stop layer over a portion of a substrate, wherein the contact etch stop layer is between the first dielectric layer and the substrate;
   lining the first opening with a first liner;
   doping the first liner with dopants, wherein the dopants comprise carbon atoms, fluorine atoms, or hydrogen atoms;
   forming a second opening in the first liner and the contact etch stop layer to expose the portion of the substrate, wherein the second opening has a sidewall that comprises both the first liner and the contact etch stop layer;
   cleaning the portion of the substrate;
   forming a silicide along a surface of the portion of the substrate through the second opening; and
   forming a first conductive material in the first opening and the second opening, the conductive material in contact with the silicide.

10. The method of claim 9, further comprising implanting ions into the substrate, wherein the implanting ions into the substrate is performed after the lining the first opening with the first liner and is performed prior to the forming the second opening.

11. The method of claim 9, further comprising implanting ions into the substrate, wherein the implanting ions into the substrate implants ions through the first liner and through an etch stop layer.

12. The method of claim 9, further comprising:
   forming a second dielectric layer over the first dielectric layer and over the first conductive material;
   forming a third opening through the second dielectric layer;
   lining the third opening with a second liner;
   forming a fourth opening through the second liner;
   cleaning the first conductive material; and
   forming a second conductive material within the third opening, the second conductive material in electrical contact with the first conductive material.

13. The method of claim 12, wherein the forming the fourth opening through the second liner further comprises forming the fourth opening through the second liner and a portion of the second dielectric layer underlying the second liner.

14. The method of claim 9, further comprising removing the first liner prior to the forming the conductive material.

15. The method of claim 9, wherein the forming the first conductive material forms the conductive material adjacent to the liner.

16. The method of claim 9, wherein the forming the second opening in the first liner further comprises forming the second opening through an etch stop layer.

17. A method of manufacturing a semiconductor device, the method comprising:
   depositing a liner along the sidewalls of a first opening in a dielectric layer and a contact etch stop layer, the dielectric layer being over a substrate and the contact etch stop layer being between the substrate and the dielectric layer, wherein the first opening does not extend through the contact etch stop layer;
   exposing the substrate through the liner and the contact etch stop layer;
   cleaning the substrate after the exposing the substrate;
   removing a portion of the liner pg,32 after the cleaning the substrate using a different process than the cleaning the substrate, the removing the first portion of the liner leaving a second portion of the liner along the sidewalls; and
   forming a first conductive material in the opening after the removing the first portion of the liner.

18. The method of claim 17, further comprising implanting ions into the substrate, wherein the implanting ions in the substrate is performed after the exposing the substrate.

19. The method of claim 17, further comprising implanting ions into the substrate, wherein the implanting ions in the substrate is performed prior to the exposing the substrate.

20. The method of claim 17 further comprising:
   forming a silicide region from the substrate after the cleaning the substrate; and
   removing a third portion of the liner after the forming the silicide region, the removing the third portion leaving a fourth portion of the liner along the sidewalls.

* * * * *

UNITED STATES PATENT AND TRADEMARK OFFICE
CERTIFICATE OF CORRECTION

PATENT NO.       : 9,252,019 B2                                    Page 1 of 1
APPLICATION NO.  : 13/222502
DATED            : February 2, 2016
INVENTOR(S)      : Wen-Chi Tsai et al.

It is certified that error appears in the above-identified patent and that said Letters Patent is hereby corrected as shown below:

In the Claims

In Col. 14, line 33, claim 17, delete "removing a portion of the liner pg. 32" and insert --removing a first portion of the liner--.

Signed and Sealed this
Third Day of May, 2016

Michelle K. Lee
*Director of the United States Patent and Trademark Office*